United States Patent [19]

Choi et al.

[11] Patent Number: 5,369,405
[45] Date of Patent: Nov. 29, 1994

[54] COEFFICIENT GENERATION APPARATUS FOR VARIABLE LENGTH DECODER

[75] Inventors: Jong S. Choi; Chang P. Lee, both of Seoul, Rep. of Korea

[73] Assignee: Goldstar Co., Ltd., Seoul, Rep. of Korea

[21] Appl. No.: 63,132

[22] Filed: May 17, 1993

[30] Foreign Application Priority Data

May 19, 1992 [KR] Rep. of Korea ............... 8455/1992
May 19, 1992 [KR] Rep. of Korea ............... 8456/1992

[51] Int. Cl.$^5$ .............................................. H03M 7/46
[52] U.S. Cl. .................................... 341/63; 341/67
[58] Field of Search ............................. 341/50, 63, 67

[56] References Cited

U.S. PATENT DOCUMENTS

| | | | |
|---|---|---|---|
| 4,499,498 | 2/1985 | Iinuma | 358/261 |
| 4,591,829 | 5/1986 | Takeda | 341/63 |
| 4,596,039 | 6/1986 | Mitchell et al. | 382/56 |
| 4,811,113 | 3/1989 | Ozeki et al. | 358/261.1 |
| 4,971,407 | 11/1990 | Hoffman | 341/87 |
| 5,060,242 | 10/1991 | Arbeiter | 375/122 |

Primary Examiner—Marc S. Hoff
Attorney, Agent, or Firm—Fliesler, Dubb, Meyer & Lovejoy

[57] ABSTRACT

A coefficient generation apparatus for a variable length decoder, capable of simplifying its circuit arrangement and reducing a processing time required to decode run-length signals and thus recover them to have actual coefficients. The apparatus comprises an absolute address generation circuit for generating an absolute address, based on a run signal from a run/level decoder, a memory control circuit for outputting the run signal of the run/level decoder and an output signal of the absolute address generation circuit and controlling outputting of a level from the run/level decoder, a first-in and first-out (FIFO) memory for storing the level and address outputted from the memory control means, and a coefficient generation circuit for outputting required level at addresses whose level values are transferred and zero at the remaining addresses, based on the run value from the FIFO memory, and thus generating a predetermined number of coefficients per block.

11 Claims, 4 Drawing Sheets

COEFFICIENT GENERATION APPARATUS FOR VARIABLE LENGTH DECODER

BACKGROUND OF THE INVENTION

1. Field of the Invention

The present invention relates to coefficient generation in variable length decoders, and more particularly to a coefficient generation apparatus for a variable length decoder, wherein coefficients are generated when data decoded in the form of run/level is converted into a row of original coefficients in a decoder of high definition television signals.

2. Description of the Prior Art

Generally, variable length decoders are adapted to decode data variable length-encoded in an encoder, into original data. In decoding, data portions including no transferred level value are added with a value of zero so that a predetermined number (64 bits) of coefficients per block are generated.

For generating these coefficients, the variable length decoders include a coefficient generation device. Conventionally, the coefficient generation device is adapted to decode a run-length signal so that it is recovered to have an actual number of coefficients. In such a coefficient generation device, however, the processing time is lengthened for matching a timing, since run lengths are variable. Moreover, the overall circuit arrangement becomes complex.

SUMMARY OF THE INVENTION

Therefore, an object of the invention is to provide a coefficient generation apparatus for a variable length decoder, capable of simplifying its circuit arrangement and reducing a processing time required to decode run-length signals and thus recover them to have actual coefficients.

In accordance with one aspect, the present invention provides a coefficient generation apparatus for a variable length decoder, comprising: a run/level decoder for decoding run/level codes received therein; an EOB (End of Block) code detector for detecting an EOB code from input block data; absolute address generation means for accumulating a run signal outputted from the run/level decoder and operating an absolute address; memory control means for selecting one of the run signal of the run/level decoder and an output signal of the absolute address generation means, to output the selected signal, and controlling outputting of a level from the run/level decoder; a first-in and first-out (FIFO) memory for storing the level and address outputted from the memory control means; and coefficient generation means for latching the level outputted from the FIFO memory, counting the address outputted from the FIFO memory, and controlling outputting of the latched level, based on the resultant counted value.

In accordance with another aspect, the present invention provides a coefficient generation apparatus for a variable length decoder, comprising: a run/level decoder for decoding run/level codes received therein and outputting them as run/level signals; an EOB detector for detecting an EOB signal from input block data and outputting an EOB detection signal upon detecting the EOB signal; absolute address generation means for receiving run signals from the run/level decoder, accumulatively summing the received run signals, converting the resultant sum into an absolute address, and outputting a carry latch signal; memory control means for receiving the level signal of the run/level decoder and the absolute address of the absolute address generation means, outputting them according to the EOB detection signal from the EOB detector, logically combining the EOB detection signal and the carry latch signal of the absolute address generation means, and outputting the result as a write signal; a FIFO memory for storing output signals outputted from the memory control means and outputting the stored signals upon receiving a read signal; and coefficient generation means for comparing the absolute address of the FIFO memory with a reference address, outputting the comparison result as the read signal, controlling outputting of the level signal and thus generating a predetermined number of coefficients per block.

BRIEF DESCRIPTION OF THE DRAWINGS

Other objects and aspects of the invention will become apparent from the following description of embodiments with reference to the accompanying drawings in which:

FIGS. 2A and 2B are schematic views illustrating input/output data of an absolute address generation circuit of FIG. 1, wherein FIG. 2A shows decoded run/level data and FIG. 2B shows data based on the generation of absolute addresses;

FIGS. 3A and 3B are schematic views illustrating input/output data of a coefficient generation circuit of FIG. 1, wherein FIG. 3A shows run/level data stored in a memory and FIG. 3B shows coefficients outputted;

DETAILED DESCRIPTION OF THE PREFERRED EMBODIMENTS

Figure 1:
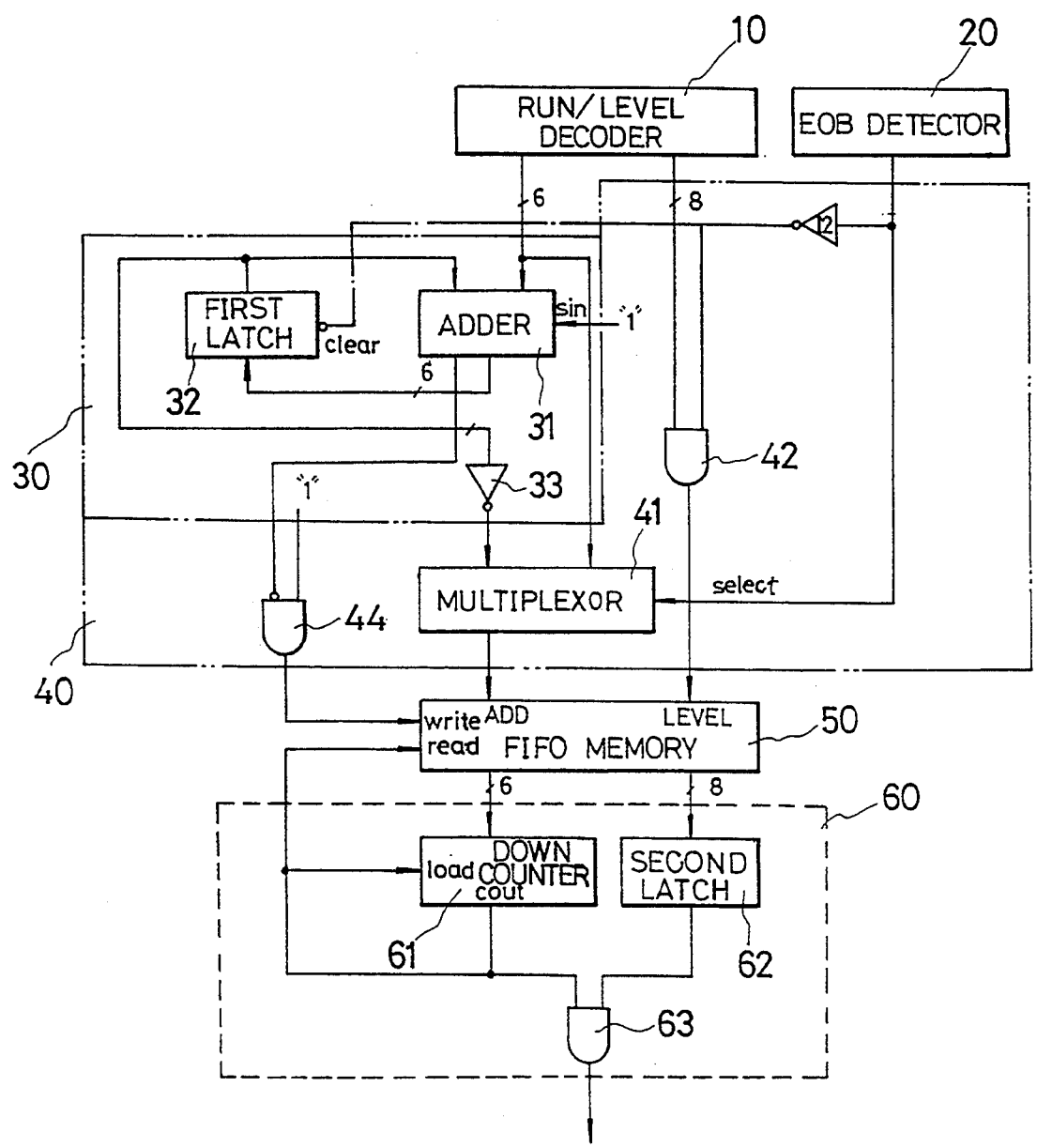
FIG. 1 is a circuit diagram of a coefficient generation apparatus for a variable length decoder in accordance with the present invention.

FIG. 1 is a circuit diagram of a coefficient generation apparatus for a variable length decoder in accordance with the present invention.

As shown in FIG. 1, the coefficient generation apparatus comprises a run/level decoder 10 for decoding run/level codes received therein, an EOB (End of Block) code detector 20 for detecting an EOB code from input block data, and an absolute address generation circuit 30 for accumulating a run signal from the run/level decoder 10 and operating an absolute address Addr. A memory control circuit 40 is also provided, which is adapted to select one of the run signal of the run/level decoder 10 and an output signal of the absolute address generation circuit 30, to output the selected signal, and control outputting of a level signal from the run/level decoder 10. The coefficient generation apparatus also comprises a first-in and first-out (FIFO) memory 50 for storing the level and address outputted from the memory control circuit 40, and a coefficient generation circuit 60 for latching the level outputted from the FIFO memory 50, counting the address outputted from the FIFO memory 50, and controlling outputting of the latched level, based on the resultant counted value.

The absolute address generation circuit 30 includes an adder 31 adapted to accumulate the run signal from the run/level decoder 10, a latch 32 adapted to latch an output from the adder 31 and send it to the adder 31, and an inverter gate 33 adapted to invert an output from the latch 32 and thus output a one's complement as an absolute address signal.

The memory control circuit 40 includes a multiplexor 41 adapted to select one of the run signal of the run/level decoder 10 and the absolute address signal of the absolute address generation circuit 30, based on an output signal from the EOB detector 20 and then output the selected signal as an address. The memory control circuit 40 also includes a pair of AND gates 42 and 44, The AND gate 42 ANDs the output signal from the EOB detector 20 and the level signal from the run/level decoder 10 and outputs the resultant signal. On the other hand, the AND gate 44 ANDs "1" and a signal obtained by inverting a carry signal of the adder 31 of the absolute generation circuit 30 and outputs the resultant signal as a write control signal for the FIFO memory 50.

On the other hand, the coefficient generation circuit 80 includes a down counter 61 for counting down an address output signal from the FIFO memory 50 and feeding back the resultant counted value to receive it as its load signal and output as a write control signal for the FIFO memory 50. The coefficient generation circuit 60 also includes a second latch 62 for latching a level output signal from the FIFO memory 50, and an AND gate 63 for ANDing an output signal from the second latch 62 and an output signal from the down counter 61 and outputting the resultant signal as a coefficient signal.

Operation of the coefficient generation apparatus with the above-mentioned construction will now be described.

First, the run/level decoder 10 decodes run/level codes received therein and outputs 0 number of run signals Run at the absolute address generation circuit 30. The run/level decoder 10 also outputs a level signal Level to the multiplexor 41, as an actual signal. The EOB detector 20 receives a data block signal and detects whether the received data block signal includes an EOB signal.

At this time, the adder 31 of the absolute address generation circuit 30 adds one to the run values upon the accumulation of run values, since the level value is also regarded as one of run values. The accumulated value is then latched in the latch 32.

Figure 2A:
Figure 2B:
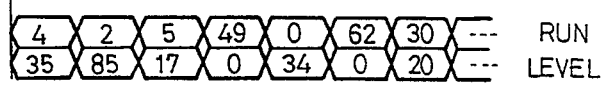

For example, where run and level signals shown in FIG. 2A are decoded in the run/level decoder 10, the adder 31 performs its accumulation by summing a previous run value (PRV), a current run value (CRV), and "1" corresponding to a level increment (PRV+CRV+1). That is, the accumulation is achieved to obtain PRV 0+CRV 4+1 at the first clock, PRV 5+CRV 2+1 at the second clock, and PRV 8+CRV 5+1 at the third clock. Where the FOB signal is detected after the accumulation at the third clock, the accumulated 14 bits of 0 to 64 bits are addresses having level values. The remaining 49 bits should be filled with the level value of 0, as shown in FIG. 2B.

Accordingly, the multiplexor 41 selects the run values outputted from the run/level decoder 10 until the FOB detector 20 detects the EOB signal and outputs the selected signal. After the EOB signal has been detected, the multiplexor 41 selects the one's complement for 64 bits outputted via the inverter gate 33 of the absolute address generation circuit 30. Also, the AND gate 42 outputs the level value of the run/level decoder 10 until the FOB signal is detected. After the EOB signal has been detected, outputting of the level value of the run/level decoder 10 is shut off. When the accumulated value of the adder 31 exceeds 64 bits, the adder 31 outputs a carry signal which is, in turn, applied to the FIFO memory 50 via the AND gate 44, thereby causing the write signal of the FIFO memory 50 to be disabled.

As a result, the run and level signals outputted from the multiplexor 41 and the AND gate are stored in the FIFO memory 50. The coefficient generating circuit 60 reads the run and level values outputted from the FIFO memory 50 and thus generates coefficients.

The coefficient generation circuit 60 fills zero in addresses corresponding to the run value, by using the run-level data stored in the FIFO memory 50, In the coefficient generation circuit 60, the level is used for the run-level decoding. This will be described hereinafter.

Figure 3A:
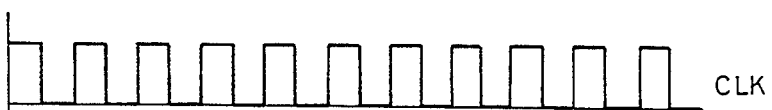

When run and level values shown in FIG. 3A enter the FIFO memory 50, the run value is loaded in the 6-bit down counter of the coefficient generation circuit 60, so that the coefficient generation circuit 60 counts down the run value. During the down counting from the run value to zero, the level values stored in the second latch 62 are outputted via the masking AND gate 63, in the form of zero value. When the down counter 61 outputs a carry-out signal as its down counting reaches zero, the FIFO memory 50 reads a new run value according to the carry-out signal and loads the new run value in the down counter 61. During the loading operation, the original level values are outputted.

Figure 3B:
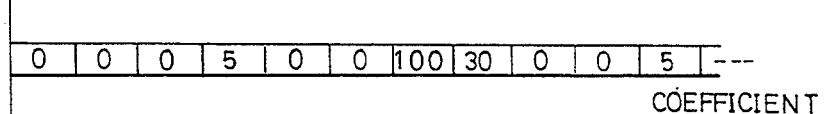

Thus, the coefficients outputted via the AND gate 63 are as shown in FIG. 3B.

As the EOB signal is inputted when run values inputted are continuously accumulated, the memory control circuit 40 makes the sum of runs per data block (64 data blocks) constant, by deriving the remaining value of the run length by the one's complement and then putting the run and level values in a data position where the EOB signal is positioned. The run and level values control led to be constant by the memory control circuit 40 are stored in the FIFO memory 50. The coefficient generation circuit 60 reads the run and level values. During the down counting from the run value to zero, the coefficient generation circuit 60 outputs a low level signal at the AND gate 63 so that zero value is outputted as the coefficient. At this time, the level value is maintained in the latch 62. When the counted value becomes zero, the original level value is outputted via the AND gate 63, as the coefficient.

Figure 4:
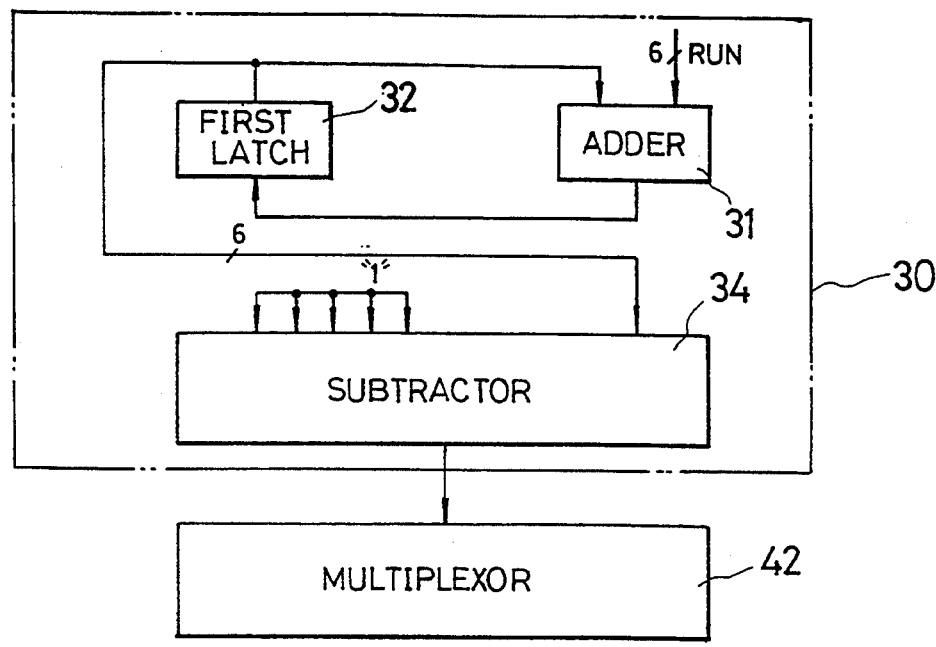
FIG. 4 is a block diagram of an absolute address generation circuit according to a modified embodiment of the present invention.

Referring to FIG. 4, there is illustrated an absolute address generation circuit according to a modified embodiment of the present invention. As shown in FIG. 4, the absolute address generation circuit includes a subtractor 34, in place of the inverter gate 33 for the one's complement. In this embodiment, the inputted run values are continuously accumulated in the adder 31 and latched in the latch 62. The subtractor 34 serves to subtract the latch value of the latch 32 from a reference value (the run value "64" of one block), so as to derive the balance run value. In this case, the same result as the case using the inverter gate 33 can be obtained. Accordingly, it is possible to derive the balance run value.

Figure 5:
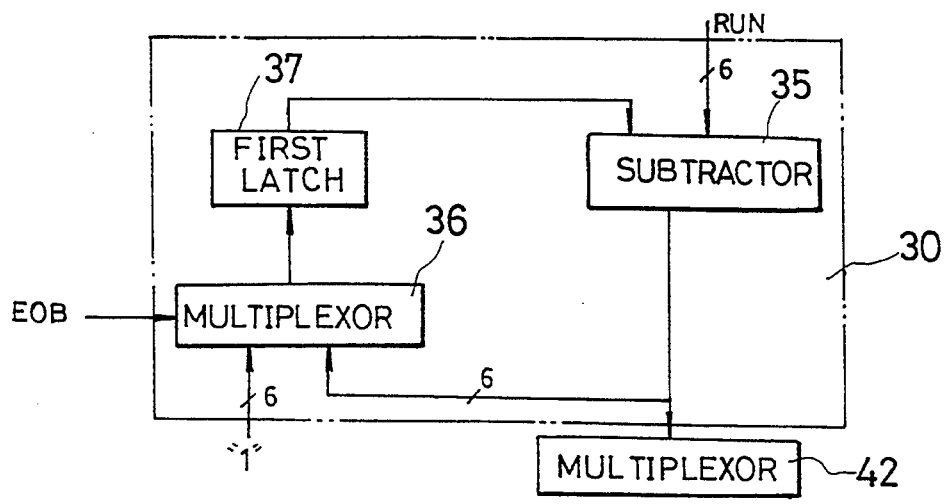
FIG. 5 is a block diagram of an absolute address generation circuit according to another modified embodiment of the present invention.

Referring to FIG. 5, there is illustrated an absolute address generation circuit according to another modified embodiment of the present invention. As shown in FIG. 5, the absolute address generation circuit includes a subtractor 35 for subtracting an input run value from a run value fed back and outputting the result as an absolute address signal, a multiplexor 36 for selecting a reference run value (64) of one block and an output signal from the subtractor 35, based on the EOB signal from the EOB detector 20, and a latch 37 for latching an output signal of the multiplexor 36 and applying it to the subtractor 35. The multiplexor 36 selects the output signal from the subtractor 35 and sends the selected signal to the latch 37, until the EOB signal is detected. After the EOB signal has been detected, the value "64" is selected and sent to the latch 37. That is, the run value of one block is continuously subtracted from 64 in the subtractor 35 which, in turn, sends the result to the multiplexor 42 of the memory control circuit 40, until the EOB signal is detected. After the EOB signal has been detected, the previous value is reset and the subtraction operation is repeated for a run value newly inputted. That is, the balance run value resulted from the subtraction of the total run value (including the level increment of 1) from 64 for one clock is sent to the multiplexor 42.

Figure 6:
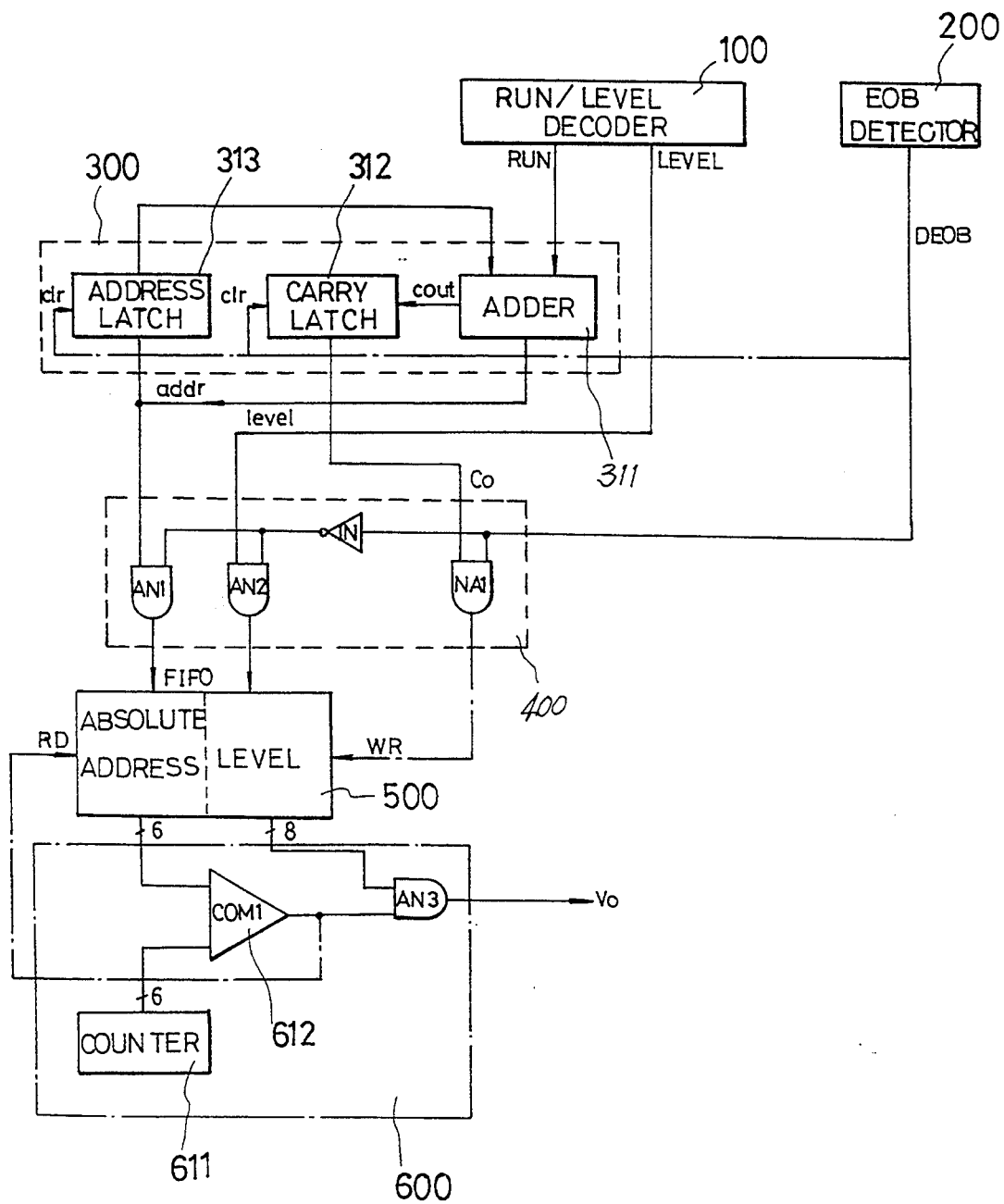
FIG. 6 is a block diagram of a coefficient generation apparatus for a variable length decoder, in accordance with another embodiment of the present invention.

On the other hand, FIG. 6 is a block diagram of a coefficient generation apparatus for a variable length decoder, in accordance with another embodiment of the present invention.

As shown in FIG. 6, the coefficient generation apparatus comprises a run/level decoder 100 for decoding run/level codes received therein and outputting it as a run/level signal and an EOB detector 200 for detecting an EOB signal from input block data and outputting an EOB detection signal $D_{EOB}$ upon detecting the EOB signal. The coefficient generation apparatus also comprises an absolute address generation circuit 300 for receiving run signals Run from the run/level decoder 100, accumulatively summing the received run signals Run, converting the sum into an absolute address Addr, and outputting a carry latch signal Co. A memory control circuit 400 is also provided, which is adapted to receive the level signal Level of the run/level decoder 100 and the absolute address Addr of the absolute address generation circuit 300, output them according to the EOB detection signal $D_{EOB}$ from the EOB detector 200, combine logically the EOB detection signal $D_{EOB}$ and the carry latch signal Co of the absolute address generation circuit 300, and output the result as a write signal WR. The coefficient generation apparatus also comprises a FIFO memory 500 for storing output signals Level and Address outputted from the memory control circuit 400 and outputting the stored signals Addr and Level upon receiving a read signal RD, and a coefficient generation circuit 600 for comparing the absolute address Addr of the FIFO memory 500 with a reference address $C_{Add}$, outputting the comparison result as the read signal RD, controlling outputting of the level signal Level and generating a predetermined number of coefficients per block.

The absolute address generation circuit 300 includes an adder 311 adapted to accumulate the run signal Run from the run/level decoder 100, output the resultant sum as an absolute address Addr and also output a carry signal Cout upon the accumulation, a carry latch 312 adapted to receive the carry signal Cout from the adder 311 and output a carry latch signal Co, and an address latch 313 adapted to detect the absolute address Addr outputted from the adder 311 and store the detected absolute address Addr therein, for an operation for next address. The carry latch 312 and the address latch 313 are constructed to be cleared by the EOB detection signal $D_{EOB}$ generated when the EOB detector 200 detects the EOB signal.

The memory control circuit 400 includes an inverter gate IN1 adapted to invert the BOB detection signal $D_{EOB}$ outputted from the EOB detector 200. A pair of AND gates AN1 and AN2 are also provided, which are adapted to be enabled for logically combining the absolute address Addr of the absolute address generation circuit 300 and the level signal Level of the run/level decoder 100, respectively, according to an output of the inverter gate IN1 and output the results at the FIFO memory 500. The memory control circuit 400 also includes a NAND gate NA1 adapted to NAND-combine the EOB detection signal and the carry latch signal Co and output the result as a write control signal for the FIFO memory 500.

On the other hand, the coefficient generation circuit 600 includes an up counter 61 for outputting a reference address $C_{Add}$, a comparator 612 for comparing the absolute address Addr outputted from the FIFO memory 500 with the reference address $C_{Add}$ outputted from the up counter 611 and outputting the comparison result as a read signal RD for the FIFO memory 500, and an AND gate AN3 for AND-combining an output signal from the comparator 612 and the level signal Level from the FIFO memory 500 and outputting the result as a coefficient Vo which is a digital signal.

Now, operation of the coefficient generation apparatus with the above-mentioned construction will be described.

First, the run/level decoder 100 decodes run/level codes received therein and outputs 0 number of run signals Run at the absolute address generation circuit 300. The run/level decoder 100 also outputs a level signal Level to the memory control circuit 400. The level signal Level is an actual value. The EOB detector 200 receives a data block signal and detects whether the received data block signal includes an EOB signal.

At this time, the adder 311 of the absolute address generation circuit 300 receives a carry output "1" from the address latch 313, so that it accumulatively sums run signals outputted from the run/level decoder 100 and converts the resultant sum into an absolute address Addr. Based on the summing, the adder 311 also outputs a carry signal Cout at the carry latch 312. The absolute addresses Addr corresponding to the sum of accumulated run signals is sent to the memory control circuit 400 and stored in the address latch 313.

Accordingly, when the EOB detector 20 detects an EOB signal and thus outputs an EEOB detection signal $D_{EOB}$ of high level, both the address latch 313 and the carry latch 312 are cleared. The carry latch 312 sends the carry latch signal Co of high Level to the NAND gate NA1 of the memory control circuit 400. At this time, the EOB detection signal $D_{EOB}$ is inverted to a high level by the inverter IN1 of the memory control circuit 400, thereby causing the AND gates AN1 and AN2 to be at their enable states.

As a result, the AND gates AN1 and AN2 of the memory control circuit 400 combine logically the absolute address Addr of the absolute address generation circuit 300 and the level signal Level of the run/level decoder 100, respectively, and output the results at the FIFO memory 500. The memory 500 to which a low level write signal WT from the memory control circuit 400 stores the absolute address Addr and the Level signal Level.

The detection of EOB signal by the EOB detector 20 occurs at two cases. One case is that the EOB signal is detected before the absolute address Addr reaches 64. In this case, the remaining addresses from the address, where the EOB signal is detected, to 64 should be filled with zero. The FIFO memory 500 receives the absolute address Addr of 64 from the adder 311 and the level signal Level of zero from the run/level decoder 100 and makes the absolute address Addr only in the form of 6 bits. Then, the FIFO memory 500 substitutes zero for 64.

The other case is that the EOB signal is detected just after the absolute address Addr becomes 64. In this case, the end of block data is confirmed. However, this conformation should not affect the generation of coefficient. When the adder 311 of the absolute address generation circuit 300 is a 6-bit adder, it sends the carry signal Cout to the carry latch 312 which, in turn, stores the received carry signal Cout, before the EOB detector 200 detects the EOB signal and outputs the EOB detection signal $D_{EOB}$. In similar to the first case, the FIFO memory 500 stores the absolute address Addr from the adder 311 and the level signal Level from the run/level decoder 100 received via the memory control circuit 400, according to the low level write signal WR from the memory control circuit 400. In this case, when the EOB detector 200 outputs the high level EOB detection signal $D_{EOB}$, both the address latch 313 and the carry latch 312 are cleared for an operation for new block data.

When the 6-bit up counter 611 of the coefficient generation circuit 600 counts the reference address $C_{Add}$ corresponding to 64 and outputs the counted value after the storage of the absolute address Addr and the level signal Level in the FIFO memory 500, the comparator 612 compares the counted value with the absolute address Addr of the FIFO memory 500. When the compared two values are not the same, the comparator 612 outputs a low level signal. By this low level signal, the AND gate AN3 of the coefficient generation circuit 600 outputs a low level signal as a coefficient Vo. Where the reference address $C_{Add}$ and the absolute address Addr are the same, the comparator 612 outputs a high level signal. By the high level signal from the comparator 612, the AND gate AN3 is enabled to output the coefficient Vo, which is a digital signal, according to the level signal Level from the FIFO memory 500.

As apparent from the above description, the present invention provides a coefficient generation apparatus wherein a generation of coefficients is achieved by previously accumulating run values, deriving the remaining run-length from the accumulated run value, storing the derived run-length in a FIFO memory, and then counting down the run-length to a run value, or comparing the run-length with a reference address. Accordingly, it is possible to simplify the overall circuit construction and make easy the overall signal processing. Where the coefficient generation apparatus is applied to high definition televisions and video conference systems, there is also provided an effect of an easy decoding of signals received.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A coefficient generation apparatus for a variable length decoder, comprising:
    a run/level decoder for decoding run/level codes received therein;
    an EOB (End of Block) code detector for detecting an code from input block data;
    absolute address generation means for accumulating a run signal outputted from the run/level decoder and generating an absolute address;
    memory control means for selecting one of the run signal of the run/level decoder and an output signal of the absolute address generation means, to output the selected signal, and controlling outputting of a level from the run/level decoder;
    a first-in and first-out (FIFO) memory for storing the level and address outputted from the memory control means; and
    coefficient generation means for latching the level outputted from the FIFO memory, counting the address outputted from the FIFO memory, and controlling outputting of the latched level, based on the resultant counted value.

2. A coefficient generation apparatus in accordance with claim 1, wherein the absolute address generation means comprises:
    an adder adapted to accumulate the run signal from the run/level decoder;
    a latch adapted to latch an output from the adder and send it to the adder; and
    an inverter gate adapted to invert an output from the latch and thus output a one's complement as an absolute address signal.

3. A coefficient generation apparatus in accordance with claim 2, wherein the absolute address generation means comprises a subtractor adapted to subtract a latch value of the latch from a run of one block, in place of the inverter gate for the one's complement, so that the balance value of the run is derived.

4. A coefficient generation apparatus in accordance with claim 2, wherein the memory control means comprises:
    a multiplexor adapted to select one of the run signal of the run/level decoder and the absolute address signal of the absolute address generation means, based on an output signal from the BOB detector and then output the selected signal as an address;
    a first AND gate adapted to AND-combine the output signal from the EOB detector and a level signal from the run/level decoder and output the resultant signal; and
    a second AND gate adapted to AND-combine "1" and a signal inverted from a carry signal of the adder of the absolute generation means and output the resultant signal as a write control signal for the FIFO memory.

5. A coefficient generation apparatus in accordance with claim 1, wherein the absolute address generation means comprises:
    a subtractor adapted to continuously subtract the run value of the run/level decoder from a run value fed back and output the subtraction result as an absolute address signal;
    a multiplexor adapted to select a reference run value of one block and an output signal from the subtractor, based on the EOB signal from the BOB detector: and a latch adapted to latch an output signal of the multiplexor and apply it to the subtractor.

6. A coefficient generation apparatus in accordance with claim 1, wherein the coefficient generation means comprises:

a down counter for counting down an address output signal from the FIFO memory and feeding back the resultant counted value to receive it as its load signal and output as a write control signal for the FIFO memory;

a second latch for latching a level output signal from the FIFO memory; and an AND gate for AND-combining an output signal from the second latch and an output signal from the down counter and outputting the resultant signal as a coefficient signal.

7. A coefficient generation apparatus for a variable length decoder, comprising:

a run/level decoder for decoding run/level codes received therein and outputting them as run/level signals;

an EOB detector for detecting an EOB signal from input block data and outputting an EOB detection signal upon detecting the EOB signal;

absolute address generation means for receiving run signals from the run/level decoder, accumulatively summing the received run signals, converting the resultant sum into an absolute address, and outputting a carry latch signal;

memory control means for receiving the level signal of the run/level decoder and the absolute address of the absolute address generation means, outputting them according to the BOB detection signal from the EOB detector, logically combining the EOB detection signal and the carry latch signal of the absolute address generation means, and outputting the result as a write signal;

a FIFO memory for storing output signals outputted from the memory control means and outputting the stored signals upon receiving a read signal; and coefficient generation means for comparing the absolute address of the FIFO memory with a reference address, outputting the comparison result as the read signal, controlling outputting of the level signal and thus generating a predetermined number of coefficients per block.

8. A coefficient generation apparatus in accordance with claim 7, wherein the absolute address generation means comprises:

an adder adapted to accumulate the run signals from the run/level decoder, output the resultant sum as an absolute address and also output a carry signal upon the accumulation;

a carry latch adapted to receive the carry signal from the adder and output a carry latch signal; and an address latch adapted to detect the absolute address outputted from the adder and store the detected absolute address therein, for an operation for next address.

9. A coefficient generation apparatus in accordance with claim 8, wherein both the carry latch and the address latch are constructed to be cleared by the EOB detection signal generated when the EOB detector detects the EOB signal.

10. A coefficient generation apparatus in accordance with claim 7, wherein the memory control means comprises:

an inverter gate adapted to invert the EOB detection signal outputted from the EOB detector;

a pair of AND gates adapted to be enabled for logically combining the absolute address of the absolute address generation means and the level signal of the run/level decoder, respectively, according to an output of the inverter gate and output the results at the FIFO memory; and a NAND gate adapted to NAND-combine the EOB detection signal and the carry latch signal and output the result as a write control signal for the FIFO memory.

11. A coefficient generation apparatus in accordance with claim 7, wherein the coefficient generation means comprises:

an up counter for outputting a reference address by its up counting operation;

a comparator for comparing the absolute address outputted from the FIFO memory with the reference address outputted from the up counter and outputting the comparison result as a read signal for the FIFO memory; and an AND gate for AND-combining an output signal from the comparator and the level signal from the FIFO memory and outputting the result as a coefficient Vo which is a digital signal.

* * * * *